(12) United States Patent
Umeda et al.

(10) Patent No.: US 10,374,569 B2
(45) Date of Patent: Aug. 6, 2019

(54) RESONANCE DEVICE AND MANUFACTURING METHOD THEREFOR

(71) Applicant: Murata Manufacturing Co., Ltd., Nagaokakyo-shi, Kyoto-fu (JP)

(72) Inventors: Keiichi Umeda, Nagaokakyo (JP); Takehiko Kishi, Nagaokakyo (JP); Hiroshi Yamada, Nagaokakyo (JP); Masakazu Fukumitsu, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/941,095

(22) Filed: Mar. 30, 2018

(65) Prior Publication Data
US 2018/0226937 A1    Aug. 9, 2018

Related U.S. Application Data

(63) Continuation of application No. PCT/JP2016/082310, filed on Oct. 31, 2016.

(30) Foreign Application Priority Data

Nov. 24, 2015   (JP) .................... 2015-229069

(51) Int. Cl.
*H03H 3/007*   (2006.01)
*H03H 9/05*    (2006.01)
(Continued)

(52) U.S. Cl.
CPC ........ *H03H 3/0072* (2013.01); *H03H 3/0077* (2013.01); *H03H 3/04* (2013.01);
(Continued)

(58) Field of Classification Search
CPC .. H03H 3/0072; H03H 9/2489; H03H 9/1057; H03H 3/0077; H03H 9/0595; H03H 3/04; H03H 9/0561; H03H 2003/0435
(Continued)

(56) References Cited

U.S. PATENT DOCUMENTS

2011/0187470 A1* 8/2011 Yamada .................. H03B 5/30
                                                    331/155
2015/0180449 A1* 6/2015 Umeda ................ H03H 3/0072
                                                    310/370
(Continued)

FOREIGN PATENT DOCUMENTS

JP          5071058 B2    11/2012
JP       2013-138285 A     7/2013
(Continued)

OTHER PUBLICATIONS

International Search Report issued for PCT/JP2016/082310, dated Jan. 17, 2017.
(Continued)

*Primary Examiner* — Robert J Pascal
*Assistant Examiner* — Jorge L Salazar, Jr.
(74) *Attorney, Agent, or Firm* — Arent Fox LLP

(57) ABSTRACT

A resonance device that includes a lower cover formed from non-degenerate silicon; a resonator having a degenerate silicon substrate with a lower surface facing the lower cover, and including first and second electrode layers laminated on the substrate with a piezoelectric film formed therebetween and having a surface opposing an upper surface of the substrate. Moreover, the lower surface of the substrate has an adjustment region where a depth or height of projections and recesses formed on the surface is larger than that in another region of the lower surface of the substrate or is a region where an area of the projections and recesses is larger
(Continued)

than that in the other region of the lower surface of the substrate.

20 Claims, 15 Drawing Sheets

(51) Int. Cl.
*H03H 3/04* (2006.01)
*H03H 9/10* (2006.01)
*H03H 9/24* (2006.01)

(52) U.S. Cl.
CPC ........ *H03H 9/0561* (2013.01); *H03H 9/0595* (2013.01); *H03H 9/1057* (2013.01); *H03H 9/2489* (2013.01); *H03H 2003/0435* (2013.01)

(58) Field of Classification Search
USPC .................. 333/133, 186, 187, 193–196
See application file for complete search history.

(56) References Cited

U.S. PATENT DOCUMENTS

| | | | |
|---|---|---|---|
| 2016/0072473 A1* | 3/2016 | Nishimura | H03H 9/21 310/370 |
| 2016/0197597 A1 | 7/2016 | Yamada et al. | |
| 2016/0294355 A1 | 10/2016 | Unami et al. | |

FOREIGN PATENT DOCUMENTS

| WO | WO 2015/0411152 A1 | 3/2015 |
|---|---|---|
| WO | WO 2015/098372 A1 | 7/2015 |

OTHER PUBLICATIONS

Written Opinion of the International Searching Authority issued for PCT/JP2016/082310, dated Jan. 17, 2017.

\* cited by examiner

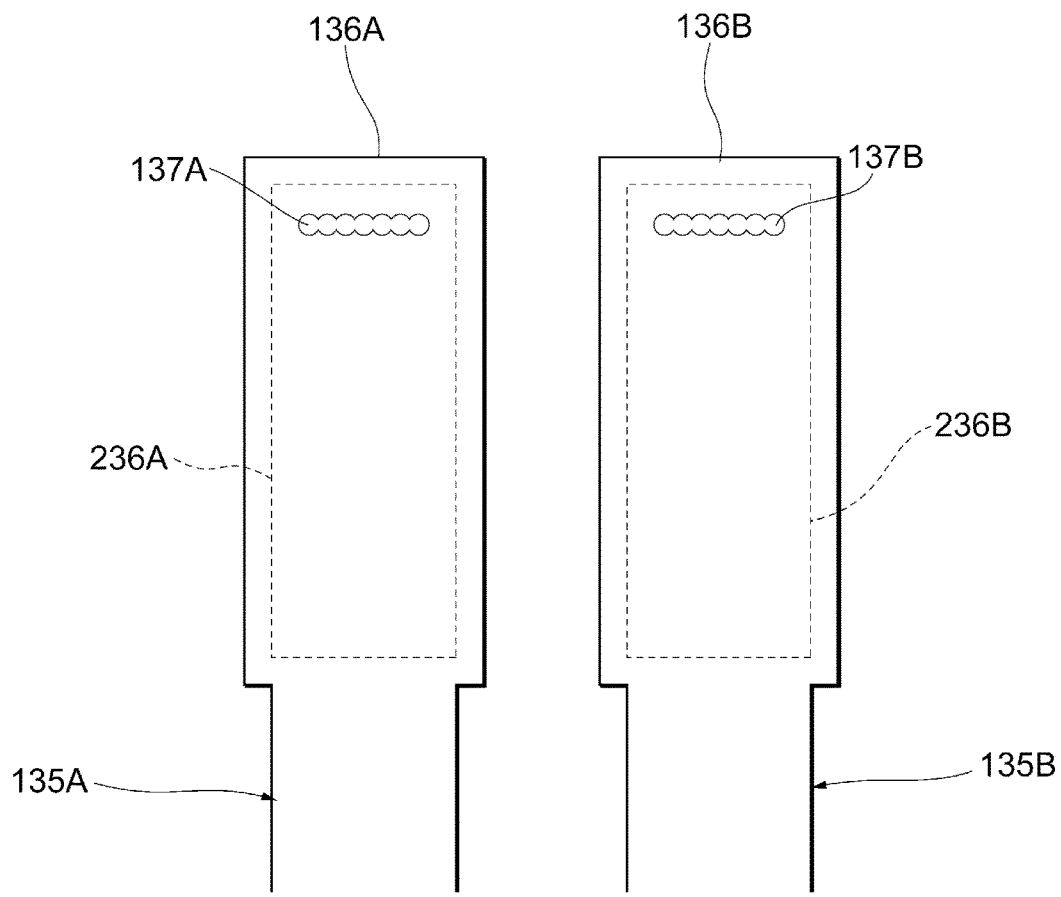

RESONANCE DEVICE AND MANUFACTURING METHOD THEREFOR

CROSS REFERENCE TO RELATED APPLICATIONS

The present application is a continuation of PCT/JP2016/082310 filed Oct. 31, 2016, which claims priority to Japanese Patent Application No. 2015-229069, filed Nov. 24, 2015, the entire contents of each of which are incorporated herein by reference.

TECHNICAL FIELD

The present disclosure relates to a resonance device formed from a silicon substrate and a manufacturing method therefor.

BACKGROUND

Currently, resonance devices using a MEMS (Micro Electro Mechanical Systems) technique are used as a timing device, for example. These resonance devices are typically mounted on a printed circuit board that is incorporated into an electronic device such as a smartphone. In general, these resonance devices include a lower substrate, an upper substrate that forms a cavity between the lower substrate and the upper substrate, and a resonator that is disposed within the cavity between the lower substrate and the upper substrate.

For example, Patent Document 1 (identified below) discloses an out-of-plane bending resonator having a plurality of vibration arms. In the exemplary resonator, each vibration arm is connected at a fixed end thereof to a front end of a base portion, and the base portion is connected at a rear end thereof, which is opposite to the front end thereof, to a support portion. For example, the support portion is connected to a base that is interposed between the lower substrate and the upper substrate. In the example of FIG. 1 of Patent Document 1, since electric fields to be applied to the vibration arms are set in directions opposite to each other, vibrations in opposite phases are achieved between an inner vibration arm and outer two vibration arms.

Patent Document 1: Japanese Patent No. 5071058.

In the resonance device as disclosed in Patent Document 1, the resonant frequency is adjusted, for example, by adjusting the film thicknesses of materials forming the resonator when the resonator is manufactured. However, when the resonant frequency is adjusted in this way, the adjusted resonant frequency fluctuates by a load being applied to the resonator due to heat or stress in a subsequent step for the production.

SUMMARY OF THE INVENTION

The present disclosure has been made in view of such circumstances, and an object of the exemplary embodiments of the present disclosure is to adjust the resonant frequency in a packaged resonance device.

Thus, a resonance device according to an exemplary aspect includes a lower cover formed from non-degenerate silicon; a resonator having a substrate formed from degenerate silicon and having a lower surface facing the lower cover, a first electrode layer and a second electrode layer laminated on the substrate, and a piezoelectric film formed between the first electrode layer and the second electrode layer and having a surface opposing an upper surface of the substrate with the first electrode layer interposed therebetween. Moreover, an upper cover is provided that faces the lower cover with the resonator interposed therebetween, and the lower surface of the substrate has an adjustment portion that is a region where a depth or height of projections and recesses formed on the surface is larger than that in another region of the lower surface of the substrate or is a region where an area of the projections and recesses is larger than that in the other region of the lower surface of the substrate.

According to the exemplary embodiments of the present disclosure, it is possible to adjust the resonant frequency in a packaged resonance device.

BRIEF DESCRIPTION OF DRAWINGS

FIG. 8A is a diagram showing an example of the shape of an adjustment portion formed by scan irradiation according to the first exemplary embodiment.

DETAILED DESCRIPTION OF EXEMPLARY EMBODIMENTS

First Embodiment

Figure 1:
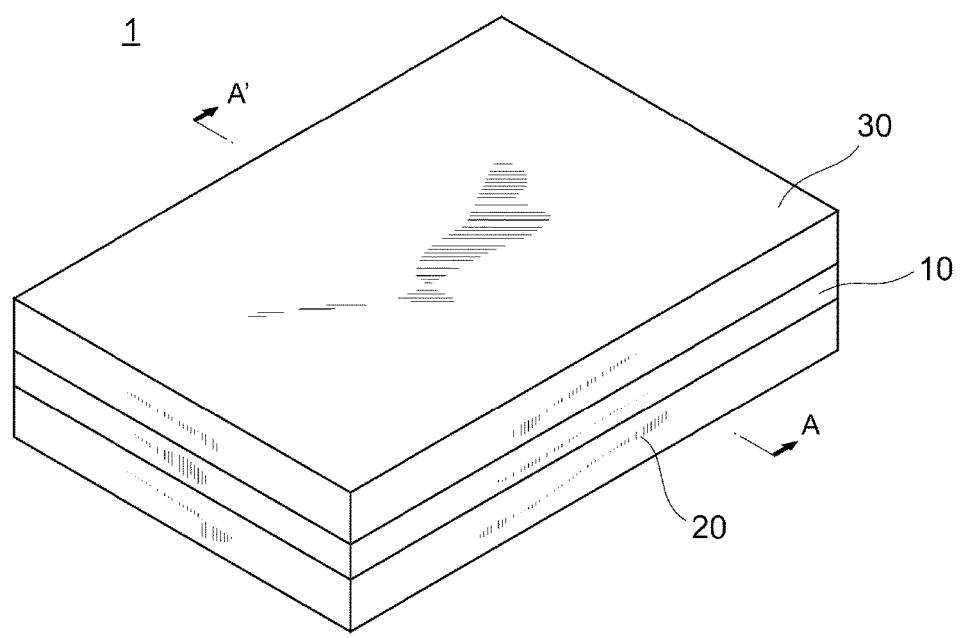
FIG. 1 is a perspective view schematically showing the appearance of a resonance device according to a first exemplary embodiment.
Figure 2:
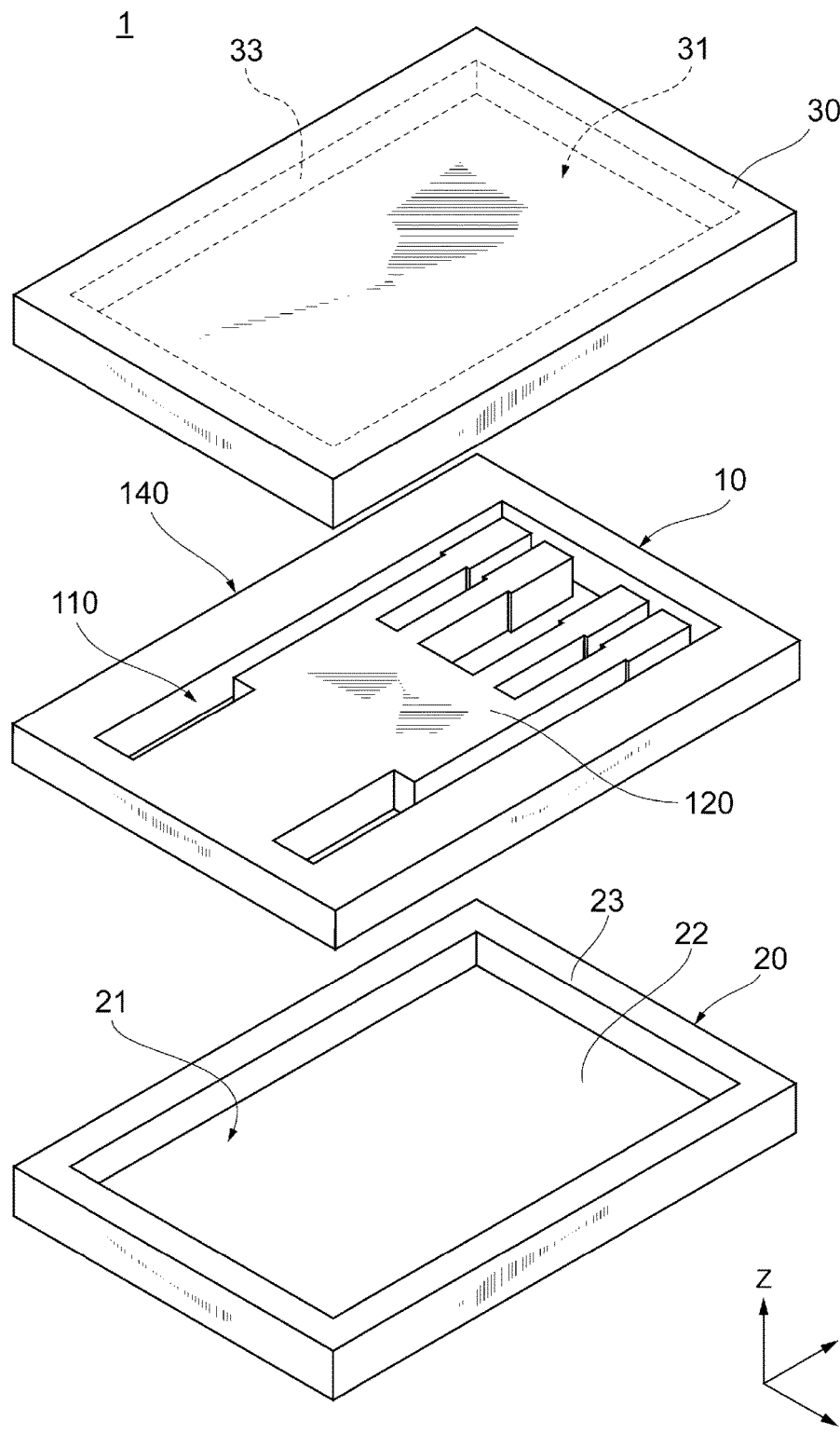
FIG. 2 is an exploded perspective view schematically showing the structure of the resonance device according to the first exemplary embodiment.

Hereinafter, a first exemplary embodiment will be described with reference to the accompanying drawings. FIG. 1 is a perspective view schematically showing the appearance of a resonance device 1 according to the first exemplary embodiment. FIG. 2 is an exploded perspective view schematically showing the structure of the resonance device 1 according to the first exemplary embodiment.

The resonance device 1 includes a resonator 10, and an upper cover 30 and a lower cover 20 provided so as to oppose each other with the resonator 10 interposed therebetween. That is, the resonance device 1 is formed by the lower cover 20, the resonator 10, and the upper cover 30 being laminated in this order.

The resonator 10, and the lower cover 20 and the upper cover 30 are joined, whereby the resonator 10 is sealed and a vibration space for the resonator 10 is formed. Each of the resonator 10, the lower cover 20, and the upper cover 30 is formed by using a Si substrate in the exemplary aspect. The resonator 10, the lower cover 20, and the upper cover 30 are joined to each other by the Si substrates being joined to each other. Each of the resonator 10 and the lower cover 20 may be formed by using an SOI substrate.

Moreover, in the exemplary aspect, the resonator 10 is a MEMS resonator produced by using a MEMS technique. In the present embodiment, the resonator 10 will be described as a resonator formed by using a silicon substrate, for example.

Hereinafter, each component of the resonance device 1 will be described in detail.

Upper Cover 30)

The upper cover 30 spreads in a flat plate shape along an XY plane, and has a recess 31 formed in a back surface thereof and having a flattened rectangular parallelepiped shape, for example. The recess 31 is surrounded by a side wall 33 and forms a part of the vibration space that is a space in which the resonator 10 vibrates.

Lower Cover 20)

The lower cover 20 has: a bottom plate 22 that is provided along the XY plane and that has a rectangular flat plate shape; and a side wall 23 that extends from the periphery of the bottom plate 22 in a Z-axis direction (that is, a lamination direction of the lower cover 20 and the resonator 10). A recess 21 is provided in the surface of the lower cover 20 opposing the resonator 10 so as to be formed by the front surface of the bottom plate 22 and the inner surface of the side wall 23. The recess 21 forms a part of the vibration space for the resonator 10. The vibration space is hermitically sealed by the above-described upper cover 30 and lower cover 20, and a vacuum state is maintained. The vibration space may be filed with a gas such as an inert gas.

Resonator 10)

Figure 3:
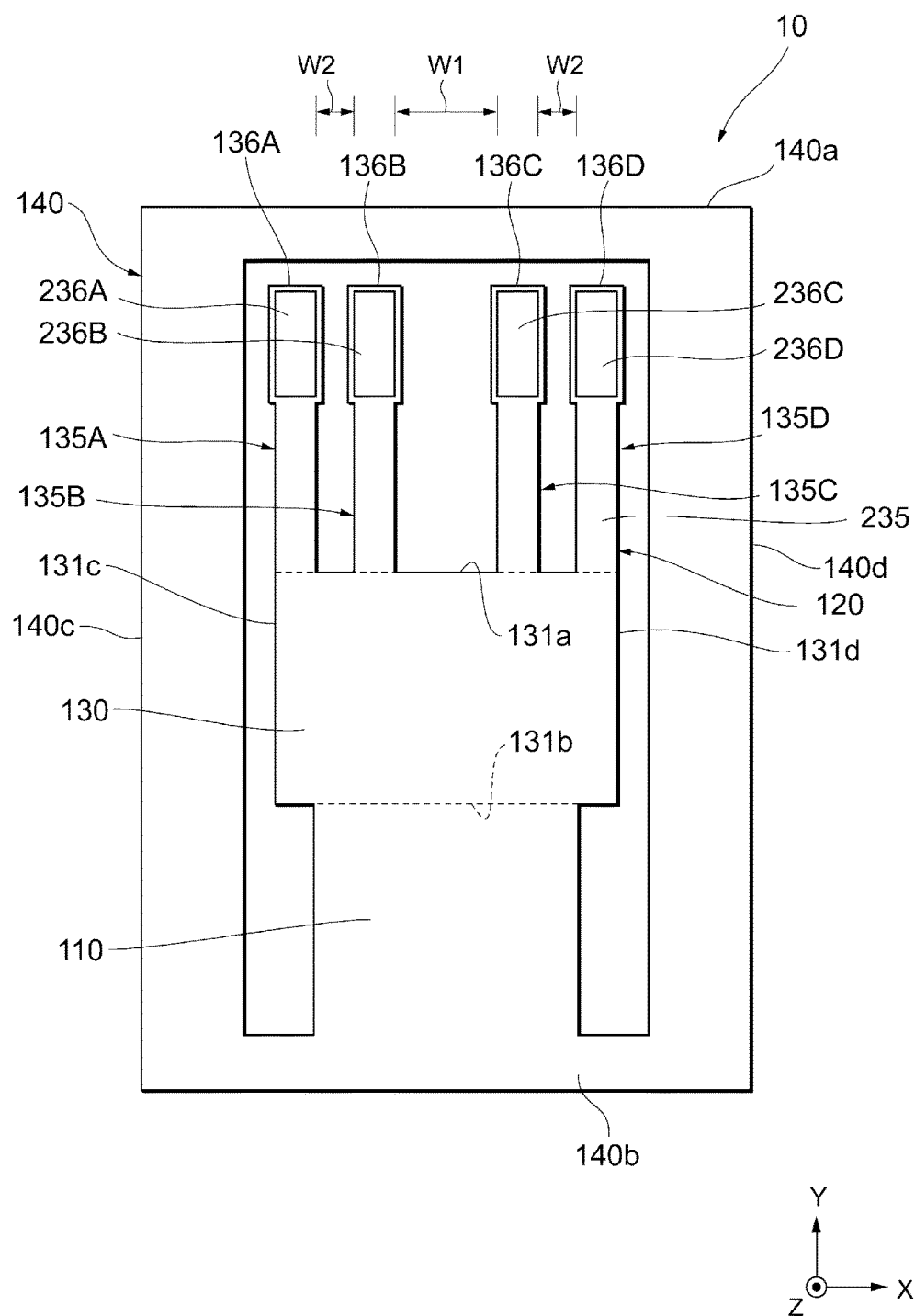
FIG. 3 is a plan view of a resonator according to the first exemplary embodiment from which an upper substrate is removed.

FIG. 3 is a plan view schematically showing the structure of the resonator 10 according to the present embodiment. Each component of the resonator 10 according to the present embodiment will be described with reference to FIG. 3. The resonator 10 includes a vibration portion 120, a holding portion 140, and a holding arm 110.

Vibration Portion 120

The vibration portion 120 has a rectangular contour spreading along the XY plane in a rectangular coordinate system in FIG. 3. The vibration portion 120 is provided inside the holding portion 140 (i.e., a "frame"), and a space is formed with a predetermined gap between the vibration portion 120 and the holding portion 140. In the example of FIG. 3, the vibration portion 120 has a base portion 130 (i.e., a "base") and four vibration arms 135A to 135D (also collectively referred to as "vibration arm 135"). The number of vibration arms is not limited to four and is set, for example, to an arbitrary number equal to or greater than 2.

In the present embodiment, each vibration arm 135 and the base portion 130 are formed so as to be integrated with each other.

As shown, the base portion 130 has long sides 131a and 131b in an X-axis direction and short sides 131c and 131d in a Y-axis direction. The base portion 130 is connected and held at the long side 131b to the holding portion 140 by the later-described holding arm 110. The base portion 130 has a substantially rectangular shape in a plan view in the example of FIG. 3. However, the shape of the base portion 130 is not limited thereto, and the base portion 130 only needs to be formed so as to be substantially symmetrical about a plane defined along the perpendicular bisector of the long side 131a. For example, the shape of the base portion 130 may be a trapezoid having a long side 131b shorter than a long side 131a, or a semicircle having a diameter at the long side 131a. The long sides 131a and 131b and the short sides 131c and 131d are not limited to straight lines and may be curved lines.

In the exemplary embodiment, each vibration arm 135 is provided parallel to the Y-axis direction between the base portion 130 and the holding portion 140, one end thereof is connected as a fixed end to the long side 131a of the base portion 130, and the other end thereof is a free end. In addition, the respective vibration arms 135 are provided so as to be aligned at predetermined intervals in the X-axis direction.

Furthermore, weight portions 136A to 136D (hereinafter, also collectively referred to as "weight portion 136") having a larger width in the X-axis direction than the fixed end side of the vibration arms 135A to 135D are formed at the free end side of the vibration arms 135A to 135D.

In the vibration portion 120 of the present embodiment, the two vibration arms 135A and 135D are disposed at the outer side in the X-axis direction, and the two vibration arms 135B and 135C are disposed at the inner side in the X-axis direction. Preferably, an interval W1 in the X-axis direction between the vibration arms 135B and 135C is set so as to be larger than an interval W2 in the X-axis direction between the outer vibration arm 135A (135D) and the inner vibration arm 135B (135C) adjacent to the outer vibration arm 135A (135D). The interval W1 is, for example, about 25 μm and the interval W2 is, for example, about 10 μm. By setting the interval W2 so as to be smaller than the interval W1, the vibration characteristics are improved. In addition, to achieve size reduction of the resonance device 1, the interval W1 may be set so as to be smaller than the interval W2, or may be equal to the interval W2.

A protective film 235 (an example of a first adjustment film) is formed on the front surface of the vibration portion 120 (the surface opposing the upper cover 30) so as to cover the entirety of the front surface. Furthermore, adjustment films 236A to 236D (an example of a second adjustment film; hereinafter, the adjustment films 236A to 236D are also collectively referred to as "adjustment film 236") are formed on the front surface of the protective film 235 on the weight portions 136A to 136D of the vibration arms 135A to 135D. It is possible to adjust the resonant frequency of the vibration portion 120 by the protective film 235 and the adjustment film 236.

The adjustment film 236 is formed such that the front surface of the adjustment film 236 is exposed in a region, in the vibration portion 120, where displacement due to vibration is relatively large. Specifically, the adjustment film 236 is formed on the weight portion 136 (an example of a second region) of the vibration arm 135. Meanwhile, the front surface of the protective film 235 is exposed in the other region (an example of a first region) in the vibration arm 135, which is a different region than the second region.

Figure 4A:
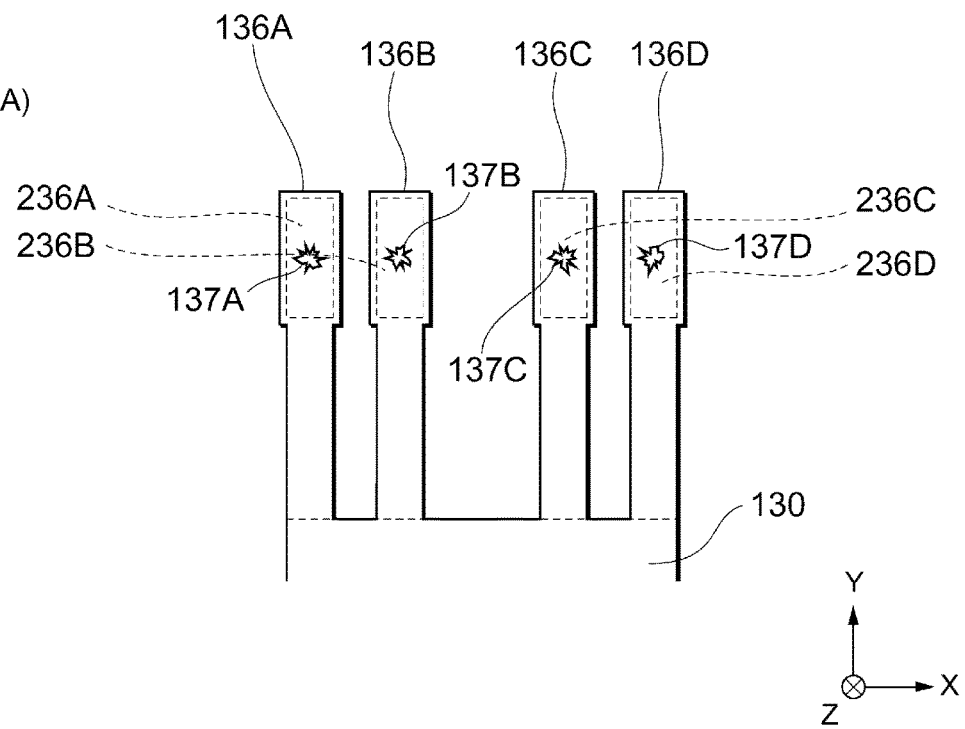
FIG. 4(A) shows a plan view of the resonator according to the first exemplary embodiment as seen from the lower cover side.
Figure 4B:
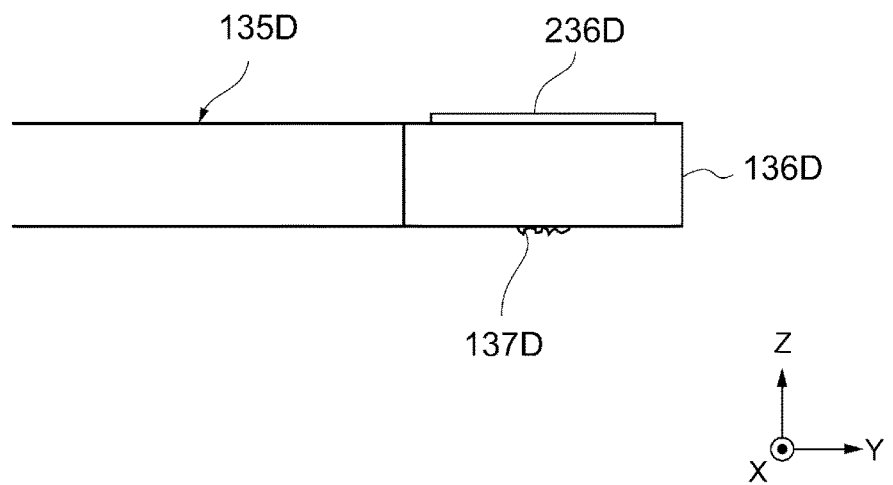
FIG. 4(B) shows a side view thereof.

The shape of the front surface of the vibration arm 135 will be described with reference to FIG. 4. FIG. 4(A) is a plan view schematically showing the lower cover 20 side surface (hereinafter, also referred to as "lower surface") of the vibration arm 135. FIG. 4(B) is a side view of the vibration arm 135D As shown in FIGS. 4(A) and 4(B), adjustment portions 137A to 137D (hereinafter, also collectively referred to as "adjustment portion 137") are formed on the lower surfaces of the weight portions 136A to 136D of the vibration arms 135A to 135D, respectively. The adjustment portion 137 refers to, in the lower surface of the vibration arm 135, a region where the depth or height of projections and recesses formed on the surface is larger than that in a region adjacent to the adjustment portion 137, or a region where the area of the projections and recesses on the surface is larger than that in the other region. The adjustment portion 137 is preferably provided on the lower surface of the vibration arm 135 and at a position corresponding to the adjustment film 236 in the thickness direction of the resonator, i.e., the Z-axis direction. Accordingly, the region where the adjustment portion 137 is disposed will have a different thickness than a region of the vibration arm 135 where the adjustment portion 137 is not disposed.

Although described in detail later, the adjustment portion 137 is formed on the lower surface of the vibration portion 120 to adjust the resonant frequency of the resonator 10 in a process for producing the resonance device 1.

In the present embodiment, the resonator 10 is described as having a shape along the XY plane as shown in FIG. 2, but the shape of the resonator 10 is not limited thereto and may be a substantially rectangular parallelepiped shape bent in the Z-axis direction. In this case, for example, the vibration arm 135 is formed in a substantially square column shape that extends in the Y-axis direction and that is bent in the Z-axis direction. Specifically, the vibration arm 135 may have a three-dimensional shape in which the vibration arm 135 gradually becomes farther from an XY plane defined along the holding portion 140 toward the Z-axis direction as coming closer to the fixed end from the free end.

(b) Holding Portion 140

Referring back to FIG. 3, a continuation of the description of the configuration of the resonator 10 will be given.

The holding portion 140 is formed in a rectangular frame shape along the XY plane. The holding portion 140 is provided along the XY plane so as to surround the outer side portion of the vibration portion 120 in a plan view. The holding portion 140 only needs to be provided at least at a part of the periphery of the vibration portion 120, and the shape of the holding portion 140 is not limited to the frame shape. For example, the holding portion 140 only needs to be provided at the periphery of the vibration portion 120 so as to be able to hold the vibration portion 120 and join the upper cover 30 and the lower cover 20.

In the present embodiment, the holding portion 140 includes square-column-shaped frame bodies 140a to 140d that are formed so as to be integrated with each other.

As shown in FIG. 3, the frame body 140a is provided so as to oppose the free end of the vibration arm 135 and such that the longitudinal direction thereof is parallel to an X axis. The frame body 140b is provided so as to oppose the long side 131b of the base portion 130 and such that the longitudinal direction thereof is parallel to the X axis. The frame body 140c is provided so as to oppose the short side 131c of the base portion 130 and the vibration arm 135A and such that the longitudinal direction thereof is parallel to a Y axis. The frame body 140c is connected at both ends thereof to ends of the frame bodies 140a and 140b. The frame body 140d is provided so as to oppose the short side 131d of the base portion 130 and the vibration arm 135D and such that the longitudinal direction thereof is parallel to the Y axis. The frame body 140d is connected at both ends thereof to the other ends of the frame bodies 140a and 140b.

In the present embodiment, the holding portion 140 is described as being covered with the protective film 235, but is not limited thereto, and the protective film 235 may not be formed on the front surface of the holding portion 140.

(c) Holding Arm 110

According to the exemplary aspect, the holding arm 110 is provided inside the holding portion 140 and connects the long side 131b of the base portion 130 and the frame body 140b. The holding arm 110 is not limited to this configuration, and, for example, the holding arm 110 may be formed of a plurality of (for example, two) arms having a bent portion and may connect the long side 131b of the base portion 130 and the frame bodies 140c and 140d of the holding portion 140.

The holding arm 110 is formed so as to spread along the XY plane defined along the holding portion 140 in FIG. 2, but is not limited thereto. For example, the shape of the holding portion 140 may be a shape bent in the Z-axis direction. Furthermore, in the present embodiment, the holding arm 110 is described as being covered with the protective film 235, but is not limited thereto, and the protective film 235 may not be formed on the front surface of the holding arm 110.

Multilayer Structure)

Figure 5:
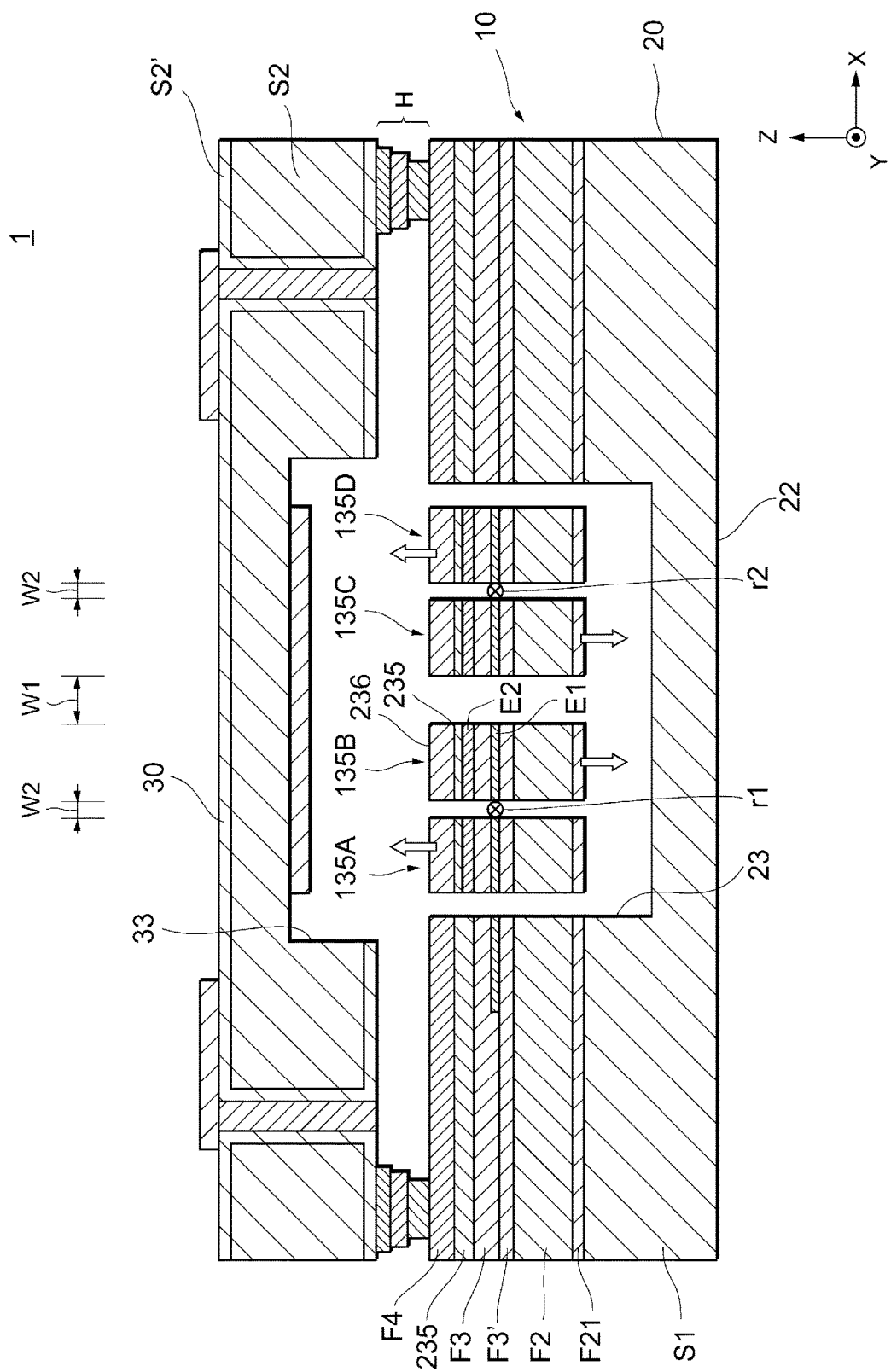
FIG. 5 is a cross-sectional view taken along the line AA' in FIG. 1.

The multilayer structure of the resonance device 1 will be described with reference to FIG. 5. FIG. 5 is a cross-sectional view taken along the line AA' in FIG. 1.

As shown in FIG. 5, in the resonance device 1 according to the present embodiment, the holding portion 140 of the resonator 10 is joined on the side wall 23 of the lower cover 20, and the holding portion 140 of the resonator 10 and the side wall 33 of the upper cover 30 are joined to each other. The resonator 10 is held between the lower cover 20 and the upper cover 30 in this manner, and the vibration space in which the vibration arm 135 vibrates is formed by the lower cover 20, the upper cover 30, and the holding portion 140 of the resonator 10.

Moreover, in the exemplary aspect, the bottom plate 22 and the side wall 23 of the lower cover 20 are preferably integrally formed of a Si (silicon) wafer S1. In addition, the lower cover 20 is joined to the holding portion 140 of the resonator 10 by the upper surface of the side wall 23. The thickness of the lower cover 20 defined in the Z-axis direction is, for example, 150 μm and the depth of the recess 21 defined in the Z-axis direction is, for example, 50 μm.

The Si wafer S1 is formed from non-degenerate silicon, and the resistivity thereof is, for example, not less than 16 mΩ·cm.

In addition, the upper cover 30 is formed of a Si (silicon) wafer S2 having a predetermined thickness. As shown in FIG. 4, the upper cover 30 is joined at the peripheral portion (side wall 33) thereof to the holding portion 140 of the resonator 10. The front surface of the upper cover 30 that opposes the resonator 10, and the back surface of the upper cover 30 are preferably covered with a silicon oxide layer S2'. A joint portion H is formed between the peripheral portion of the upper cover 30 and the holding portion 140 in order to join the upper cover 30 and the holding portion 140. The joint portion H is formed of, for example, an Al (aluminum) film and a Ge (germanium) film. The joint portion H may be formed of an Au (gold) film and a Sn (tin) film.

In the resonator 10, the holding portion 140, the base portion 130, the vibration arm 135, and the holding arm 110 are integrally formed by the same process. In the resonator 10, first, a piezoelectric thin film F3' is laminated on a Si (silicon) substrate F2 (an example of a substrate), and a metal layer E1 (an example of a first electrode layer) is laminated on the piezoelectric thin film F3'. A piezoelectric thin film F3 (an example of a piezoelectric film) is laminated on the metal layer E1 so as to cover the metal layer E1, and a metal layer E2 (an example of a second electrode layer) is laminated on the piezoelectric thin film F3. The protective film 235 is laminated on the metal layer E2 so as to cover the metal layer E2.

On the vibration portion 120, furthermore, the adjustment film 236 is laminated on the protective film 235. Meanwhile, on the holding portion 140, an insulating film F4 formed from an insulator is laminated on the protective film 235.

The Si substrate F2 is formed from, for example, a degenerate n-type Si semiconductor having a thickness of about 6 μm, and may contain P (phosphorus), As (arsenic), or Sb (antimony), or the like as an n-type dopant. The resistance value of degenerate Si to be used for the Si substrate F2 is, for example, less than 16 mΩ·cm, and more preferably not greater than 1.2 mΩ·cm. Furthermore, a silicon oxide (for example, $SiO_2$) layer F2' (an example of a temperature characteristic correction layer) is formed on the lower surface of the Si substrate F2. Accordingly, it is possible to improve the temperature characteristics.

In the present embodiment, the temperature characteristic correction layer refers to a layer having a function to reduce the temperature coefficient of the frequency (that is, a rate of change per temperature) of the vibration portion when the temperature correction layer is formed on the Si substrate F2 as compared to the case where the temperature characteristic correction layer is not formed on the Si substrate F2. By the vibration portion 120 having the temperature characteristic correction layer, it is possible to reduce change, over temperature, of the resonant frequency of a multilayer structure formed of the Si substrate F2, the metal layers E1 and E2, the piezoelectric thin film F3, and the silicon oxide layer (temperature correction layer) F2', for example.

In the resonator 10, the silicon oxide layer F2' is desirably formed with a uniform thickness. The uniform thickness means that variations in the thickness of the silicon oxide layer F2' are within ±20% from the thickness average.

Moreover, the silicon oxide layer F2' may be formed on the upper surface of the Si substrate F2 or may be formed on both the upper surface and the lower surface of the Si substrate F2.

On the holding portion 140, the silicon oxide layer F2' may not be formed on the lower surface of the Si substrate F2.

The metal layers E2 and E1 are formed by using, for example, Mo (molybdenum), aluminum (Al), or the like having a thickness of about 0.1 to 0.2 μm.

The metal layers E2 and E1 are formed in a desired shape by etching or the like. The metal layer E1 is formed, for example, on the vibration portion 120 so as to serve as a lower electrode (an example of an electrode layer). The metal layer E1 is formed on the holding arm 110 and the holding portion 140 so as to serve as a wire for connecting the lower electrode to an AC power supply provided outside the resonator 10.

Meanwhile, the metal layer E2 is formed on the vibration portion 120 so as to serve as an upper electrode (an example of the electrode layer). In addition, the metal layer E2 is formed on the holding arm 110 and the holding portion 140 so as to serve as a wire for connecting the upper electrode to a circuit provided outside the resonator 10.

It should be appreciated that for connection from the AC power supply to a lower wire or an upper wire, an electrode may be formed on the outer surface of the upper cover 30 to connect the circuit to the lower wire or the upper wire, or a via may be formed within the upper cover 30, and a conductive material is filled into the via to provide a wire that connects the AC power supply to the lower wire or the upper wire.

The piezoelectric thin films F3 and F3' are piezoelectric thin films that convert an applied voltage to vibration, and may contain, for example, an oxide or a nitride such as AlN (aluminum nitride), as a principal component. Specifically, the piezoelectric thin films F3 and F3' may be formed from ScAlN (scandium aluminum nitride). ScAlN is obtained by substituting a part of aluminum in aluminum nitride with scandium. In addition, the piezoelectric thin film F3 has, for example, a thickness of 1 μm, but may have a thickness of about 0.2 μm to 2 μm.

During operation, the piezoelectric thin film F3 expands and contracts in the in-plane direction of the XY plane, that is, in the Y-axis direction, in accordance with an electric field applied to the piezoelectric thin film F3 by the metal layers E2 and E1. Due to the expansion and contraction of the piezoelectric thin film F3, the vibration arm 135 displaces the free end thereof toward the inner surfaces of the lower cover 20 and the upper cover 30 to vibrate in an out-of-plane bending vibration mode.

In the present embodiment, the phase of an electric field to be applied to the outer vibration arms 135A and 135D and the phase of an electric field to be applied to the inner vibration arms 135B and 135C are set so as to be opposite to each other. Accordingly, the outer vibration arms 135A and 135D and the inner vibration arms 135B and 135C are displaced in directions opposite to each other. For example, when the outer vibration arms 135A and 135D displace the free ends thereof toward the inner surface of the upper cover 30, the inner vibration arms 135B and 135C displace the free ends thereof toward the inner surface of the lower cover 20.

The protective film 235 is formed from a material having a lower rate of weight reduction by etching than the adjustment film 236. For example, the protective film 235 is formed of a nitride film such as AlN and SiN or an oxide film such as $Ta_2O_5$ (tantalum pentoxide) and $SO_2$. The rate of weight reduction is represented by the product of an etching rate (a thickness removed per unit time) and a density.

The adjustment film 236 is formed from a material having a higher rate of weight reduction by etching than the protective film 235. For example, the adjustment film 236 is formed from a metal such as molybdenum (Mo), tungsten (W), gold (Au), platinum (Pt), and nickel (Ni).

When the protective film 235 and the adjustment film 236 have the above-described relationship of the rate of weight reduction, the magnitude relationship of the etching rate therebetween is arbitrary.

The adjustment film 236 is initially formed on substantially the entire surface of the vibration portion 120 and then formed only in a predetermined region by a removal processing such as etching.

Etching of the protective film 235 and the adjustment film 236 is performed, for example, by simultaneously irradiating the protective film 235 and the adjustment film 236 with an ion beam (for example, an argon (Ar) ion beam). It is possible to irradiate a wider range than the resonator 10 with the ion beam. In the present embodiment, an example in which the etching is performed with the ion beam is described, but the etching method is not limited to the method with the ion beam.

In the resonance device 1 as described above, during vibration in opposite phases, the vibration arm 135A and the vibration arm 135B vibrate in vertically opposite directions about a central axis r1 extending parallel to the Y axis between the vibration arm 135A and the vibration arm 135B shown in FIG. 5. In addition, the vibration arm 135C and the vibration arm 135D vibrate in vertically opposite directions about a central axis r2 extending parallel to the Y axis between the vibration arm 135C and the vibration arm 135D. Accordingly, torsional moments in directions opposite to each other occur at the central axes r1 and r2, and bending vibration occurs at the base portion 130.

Process Flow)

FIG. 6A to 6H are diagram showings an example of process flow for the resonator 10 according to the present embodiment. In FIG. 6A to 6H, for the sake of convenience, one resonance device 1 among a plurality of resonance devices 1 to be formed on a wafer is shown and described. The resonance device 1 is obtained by forming a plurality of resonance devices on one wafer and dividing the wafer similarly to an ordinary MEMS process.

Figure 6A:
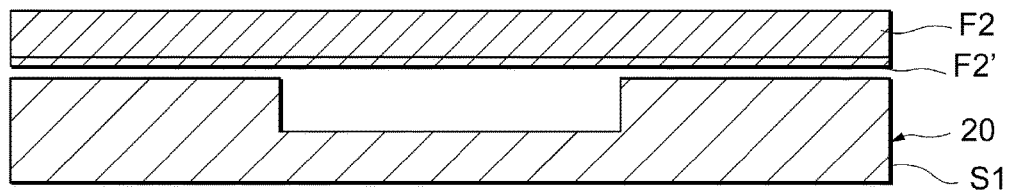
FIG. 6A is a diagram showing an example of process flow for the resonance device according to the first exemplary embodiment.

The initial step shown in FIG. 6A, the silicon oxide layer F2' is formed on the prepared Si substrate F2 by thermal oxidation. Next, the lower cover 20 having the recess 21 is prepared, the lower cover 20 and the Si substrate F2 having the silicon oxide layer F2' formed thereon are disposed such that the lower surface of the Si substrate F2 opposes the lower cover 20, and the lower cover 20 and the Si substrate F2 are joined to each other at the side wall 23. Although not shown in FIG. 6, the front surface of the Si substrate F2 is preferably planarized by treatment, such as chemical-mechanical polishing and etchback, after the joining.

Figure 6B:
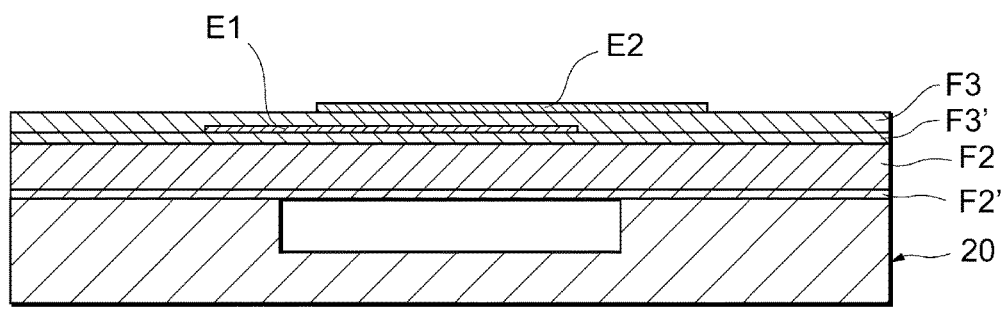
FIG. 6B is a diagram showing the example of the process flow for the resonance device according to the first exemplary embodiment.

Furthermore, the piezoelectric thin film F3' is stacked on the front surface of the Si substrate F2, and the metal layer E1 is stacked on the piezoelectric thin film F3'. The metal layer E1 is shaped into a desirable shape by processing such as etching. Next, the piezoelectric thin film F3 and the metal layer E2 are stacked on the front surface of the metal layer E1 in this order. After being stacked, the metal layer E2 is shaped into a desirable shape by processing such as etching (FIG. 6B).

Figure 6C:
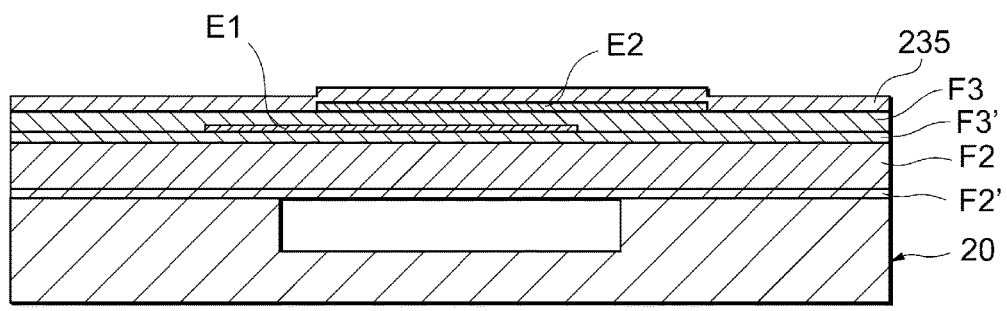
FIG. 6C is a diagram showing the example of the process flow for the resonance device according to the first exemplary embodiment.

Furthermore, the protective film 235 is stacked on the front surface of the shaped metal layer E2 (FIG. 6C).

Figure 6D:
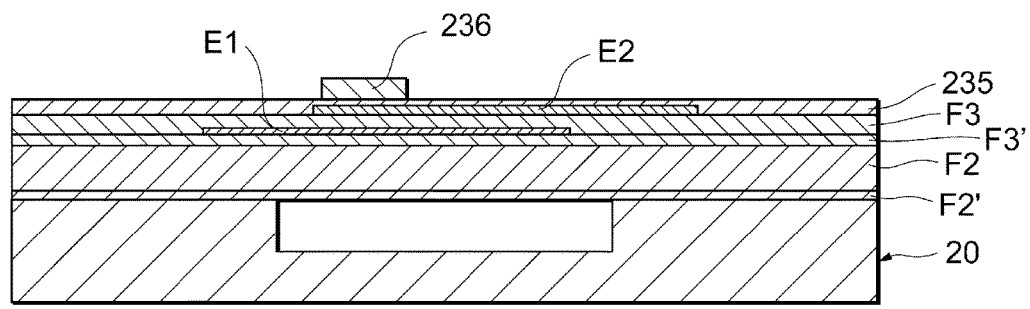
FIG. 6D is a diagram showing the example of the process flow for the resonance device according to the first exemplary embodiment.

Furthermore, a metal layer such as molybdenum is stacked on the front surface of the protective film 235, and the adjustment film 236 is formed near a portion that is to be the free end of the vibration arm 135 (see FIG. 6F), by processing the metal layer by etching or the like (FIG. 6D).

Figure 6E:
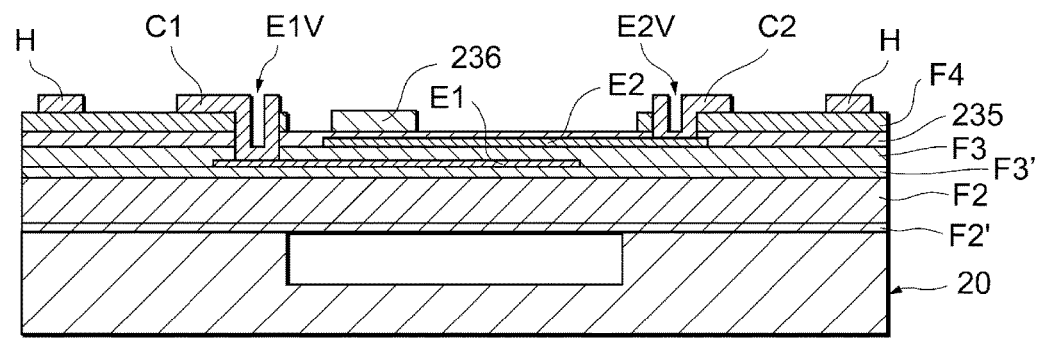
FIG. 6E is a diagram showing the example of the process flow for the resonance device according to the first exemplary embodiment.

Next, in the step shown in FIG. 6E, vias E1V and E2V for connecting the lower electrode and the upper electrode to the outer power supply are formed in the resonator 10. After the vias E1V and E2V are formed, a metal such as aluminum is filled into the vias E1V and E2V, whereby extended lines C1 and C2 for extending the metal layers E1 and E2 to the holding portion 140 are formed. Moreover, the joint portion H is formed on the holding portion 140.

Figure 6F:
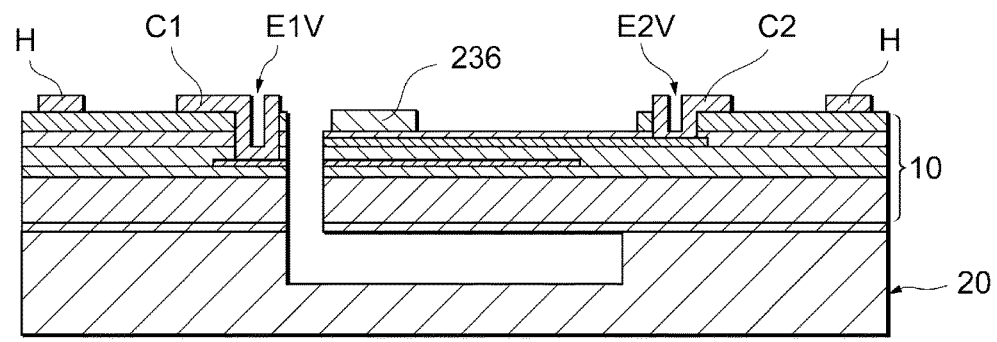
FIG. 6F is a diagram showing the example of the process flow for the resonance device according to the first exemplary embodiment.

Thereafter, the metal layer E2, the piezoelectric thin film F3, the metal layer E1, the Si substrate F2, and the silicon oxide layer F2' are sequentially removed by processing such as etching, whereby the vibration portion 120 and the holding arm 110 are formed, and the resonator 10 is formed (FIG. 6F).

After the resonator 10 is formed in the step shown in FIG. 6F, a trimming step of adjusting the film thickness of the adjustment film 236 is performed. It is possible to reduce frequency variations among a plurality of resonance devices 1 produced on the same wafer, by the trimming step.

In the trimming step, the resonant frequency of each resonator 10 is measured, and a frequency distribution is calculated. Next, the film thickness of the adjustment film 236 is adjusted on the basis of the calculated frequency distribution. The film thickness of the adjustment film 236 may be adjusted, for example, through etching of the adjustment film 236 by irradiating the entire surface of the resonance device 1 with an argon (Ar) ion beam. Furthermore, after the film thickness of the adjustment film 236 is adjusted, the resonator 10 is desirably washed to remove scattered films.

In the trimming step, instead of measuring a frequency, it is possible to measure the film thicknesses of the piezoelectric thin film F3 and the protective film 235 and estimate a frequency from the film thicknesses. In this case, first, the film thicknesses of the piezoelectric thin film F3 and the protective film 235 are measured. Then, the film thickness of the adjustment film 236 may be adjusted on the basis of the film thicknesses of the piezoelectric thin film F3 and the protective film 235 by etching or the like.

Figure 6G:
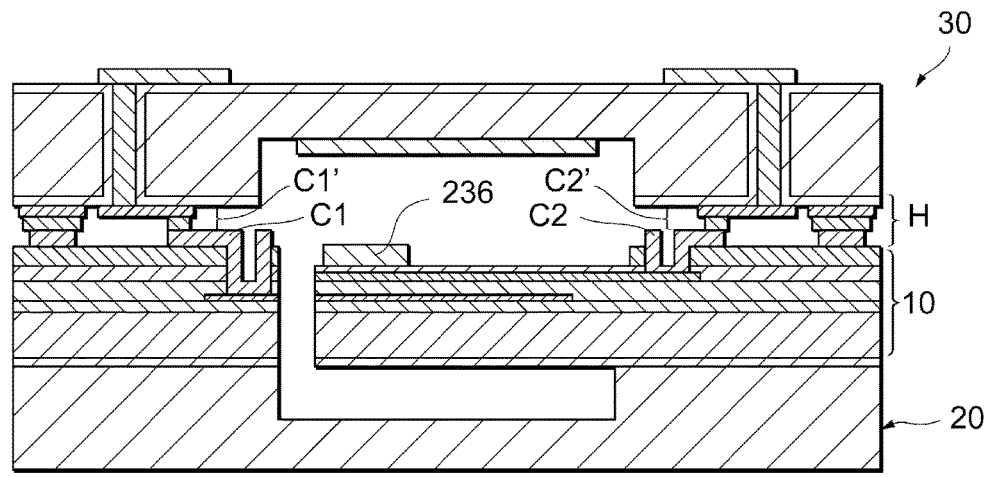
FIG. 6G is a diagram showing the example of the process flow for the resonance device according to the first exemplary embodiment.

Next, in the step shown in FIG. 6G, the upper cover 30 and the lower cover 20 are opposed to each other with the resonator 10 interposed therebetween. The upper cover 30 that has been aligned such that the recess 31 of the upper cover 30 and the recess 21 of the lower cover 20 coincide with each other, is joined to the lower cover 20 via the joint portion H. In addition, electrodes C1' and C2' are formed on the upper cover 30 so as to be connected to the extended lines C1 and C2. The electrodes C1' and C2' each include, for example, an aluminum layer and a germanium layer. The metal layers E1 and E2 are connected via the electrodes C1' and C2' to a circuit provided outside.

Figure 6H:
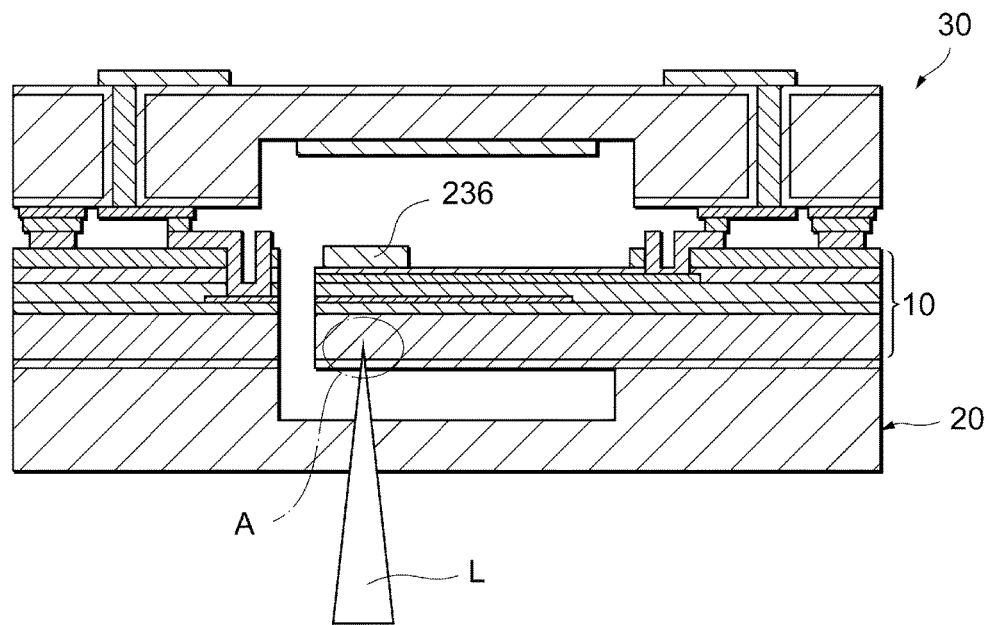
FIG. 6H is a diagram showing the example of the process flow for the resonance device according to the first exemplary embodiment.

After the lower cover 20 and the upper cover 30 are joined to each other, and the plurality of resonance devices 1 are formed by cutting with a dicing machine, a fine adjustment step of finely adjusting the resonant frequency is performed in the step shown in FIG. 6H. In the fine adjustment step, while the resonant frequency is measured, a laser L is applied from below the lower cover 20, focusing on a region A of the weight portion 136 of the vibration arm 135 of the resonator 10.

The laser used in the fine adjustment step has a wavelength in the infrared to near-infrared range. Specifically, a YAG laser having a wavelength of 1064 nm is preferably used. At the wavelength in this range, the laser passes through non-degenerate silicon but is absorbed by degenerate silicon. Therefore, the energy of the laser L is absorbed by the lower surface of the Si substrate F2, which is formed from degenerate silicon. The absorbed energy changes to heat, and thus it is possible to melt and re-evaporate the silicon oxide layer F2' disposed in the region A (near the free end of the vibration arm 135) to which the laser L is applied. By applying the laser, it is also possible to melt and re-evaporate both the silicon oxide layer F2' and the Si substrate F2. Furthermore, the metal layer E1, the piezoelectric thin film F3, the metal layer E2, the protective film 235, and the adjustment film 236 may also be melted and re-evaporated. When a frequency amount to be adjusted is a small amount that is not greater than 1000 ppm, only the silicon oxide layer F2' is desirably melted and re-evaporated to be removed. On the other hand, when the frequency amount to be adjusted is not less than 1000 ppm, both the Si substrate F2 and the silicon oxide layer F2' are desirably melted and re-evaporated to be removed. As described above, by forming the adjustment portion 137 having projections and recesses on the lower surface thereof, it is possible to adjust the resonant frequency.

Figure 7:
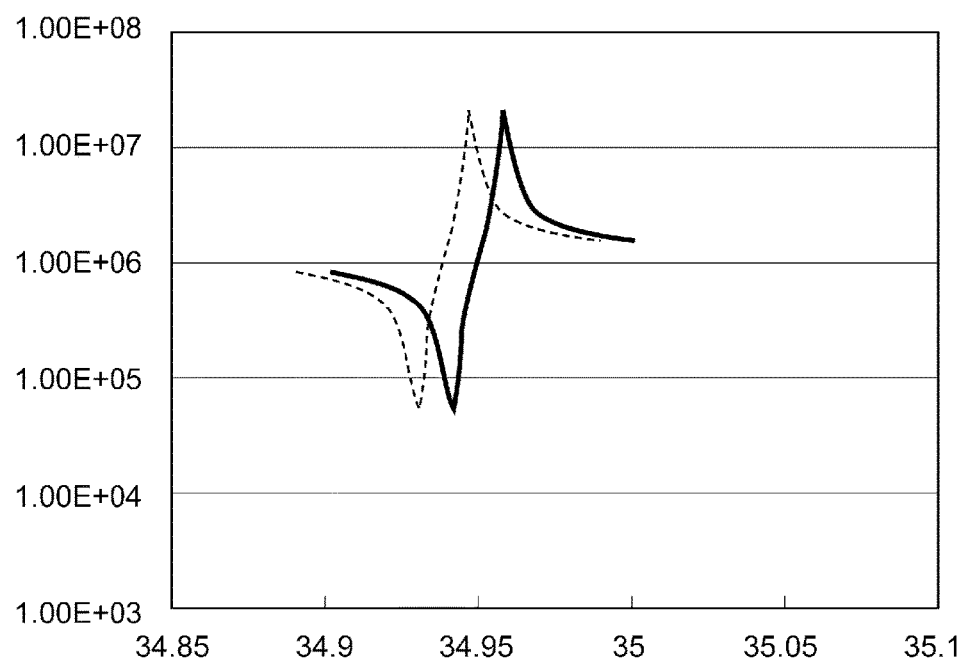
FIG. 7 is a graph showing a shift amount of a resonant frequency before and after a resonant frequency fine adjustment step according to the first exemplary embodiment.

FIG. 7 is a graph showing a shift amount of the frequency before and after the fine adjustment step. In FIG. 7, the vertical axis indicates impedance (Ω), the horizontal axis indicates frequency (kHz), a broken line represents a waveform before the fine adjustment step, and a solid line represents a waveform after the fine adjustment step. FIG. 7 shows a shift amount of the frequency in the case where spot irradiation with a laser is performed with the following parameters, and the adjustment portion 137 having the shape shown in FIG. 4 is formed. The spot irradiation refers to an irradiation method in which a laser is applied to a single irradiation position for a predetermined time. The adjustment portion 137 is formed at one location on the front surface of each vibration arm 135 on which the spot irradiation is performed.

According to this aspect, the following parameters are used:
Irradiation power: 0.08 W
Irradiation time: 1 sec/point
Focus position: near side (lower cover 20 side) from the lower surface of the vibration arm 135 by several tens of micrometers As shown in FIG. 7, in the present embodiment, it appears that the frequency shifts in the positive direction by about 750 ppm due to the fine adjustment step.

Figure 8B:
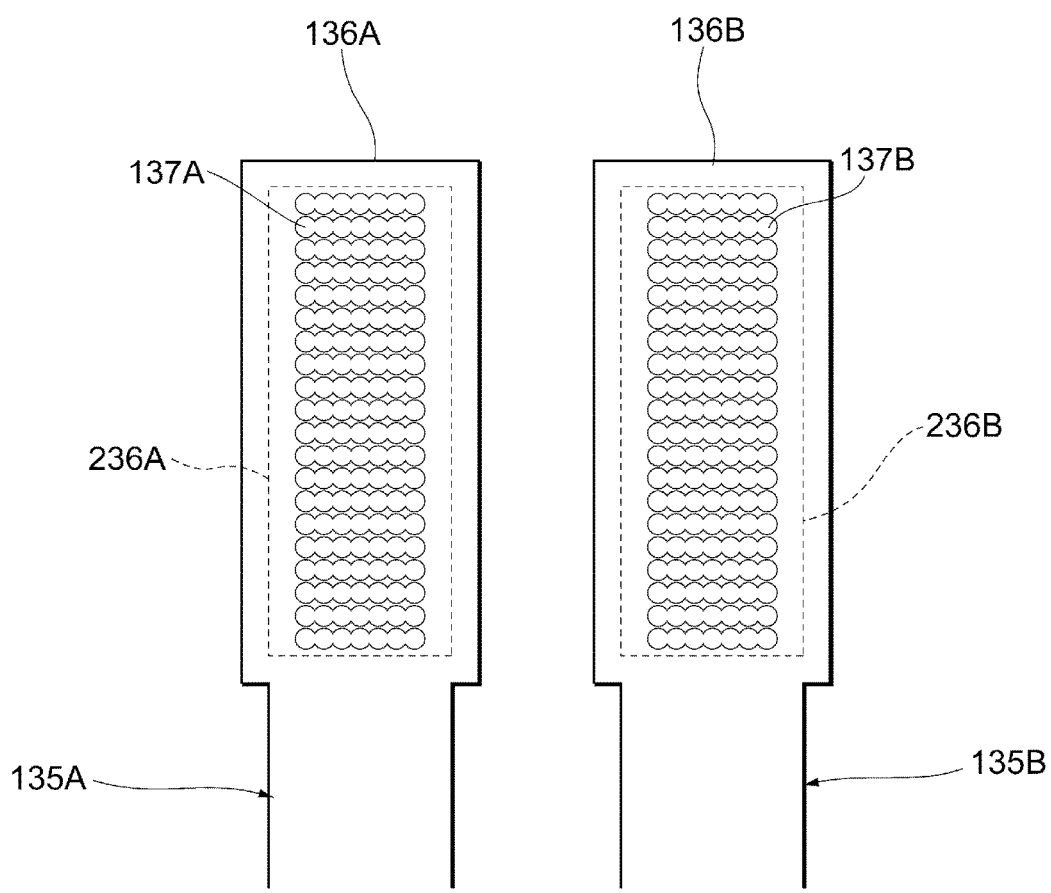
FIG. 8B is a diagram showing an example of the shape of the adjustment portion formed by scan irradiation according to the first exemplary embodiment.
Figure 8C:
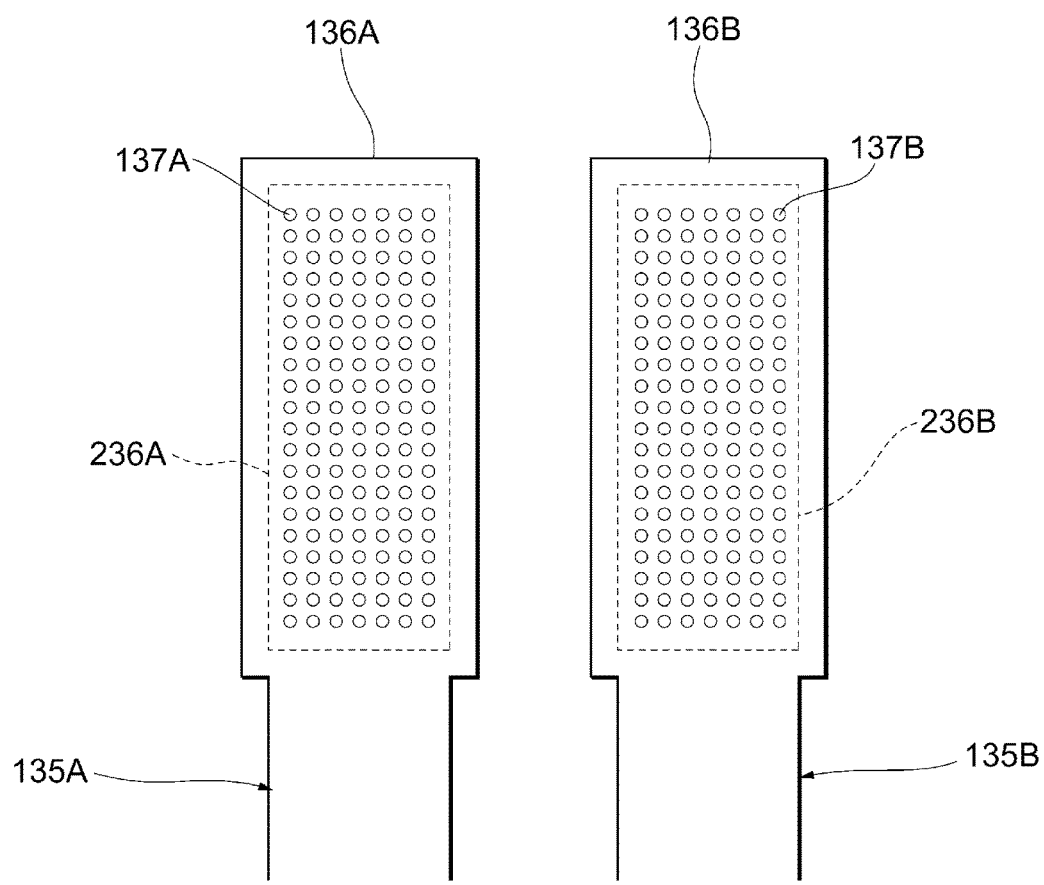
FIG. 8C is a diagram showing an example of the shape of the adjustment portion formed by scan irradiation according to the first exemplary embodiment.

For the fine adjustment step, it is possible to use an irradiation method other than the spot irradiation. FIG. 8A to 8C are diagram schematically showings the shape of the lower surface of the vibration arm 135 in the case of scan irradiation. The scan irradiation refers to an irradiation method in which a laser is applied in a predetermined direction at a constant speed.

FIG. 8A shows the shape of the lower surface of the vibration arm 135 in the case where scan irradiation with a laser is performed with the following parameters on the vibration arm 135 in which the width of the weight portion 136 is 70 μm.
Irradiation power: 1.5 W
Scan speed: 100 mm/sec
Irradiation width (X-axis direction): 40 μm
Focus position: depth side (upper cover 30 side) from the lower surface of the vibration arm 135 by several tens of micrometers In the example of FIG. 8A, an adjustment portion 137 having a longitudinal direction that is substantially parallel to the free end of the vibration arm 135 is formed on the front surface of the vibration arm 135 on which the scan irradiation has been performed. It should be appreciated that a plurality of adjustment portions 137 may be formed substantially parallel to the free end of the vibration arm 135 so as to be spaced apart from each other. The adjustment portions 137 formed on the respective vibration arms 135 are aligned on the same straight lines between the respective vibration arms 135.

In the case where the adjustment portion 137 having the shape shown in FIG. 8A is formed, the frequency shift amount is, for example, 38 ppm in the positive direction.

FIG. 8B shows the shape of the lower surface of the vibration arm 135 in the case where multi-scan irradiation with a laser is performed with the following parameters on the vibration arm 135 in which the width of the weight portion 136 is 70 μm.
Irradiation power: 1.5 W
Scan speed: 100 mm/sec
Irradiation width (X-axis direction): 40 μm
Number of irradiation lines: 20 at intervals of 5 μm
Focus position: depth side (upper cover 30 side) from the lower surface of the vibration arm 135 by several tens of micrometers In the example of FIG. 8B, a plurality of the adjustment portions 137 shown in FIG. 8A are aligned on the front surface of each vibration arm 135, on which the multi-scan irradiation has been performed, at substantially equal intervals so as to be parallel to each other. Furthermore, the plurality of the adjustment portions 137 formed on each vibration arm 135 are aligned on the same straight line between the respective vibration arms 135. The plurality of the adjustment portions 137 may be formed so as to be in contact with each other.

In the case where the adjustment portions 137 having the shape shown in FIG. 8B are formed, the frequency shift amount is, for example, 100 ppm in the positive direction.

The shape of the front surface of each vibration arm 135 on which the multi-scan irradiation has been performed is not limited to the example of FIG. 8B. For example, in the example of FIG. 8C, a plurality of adjustment portions 137 are formed on the front surface of the vibration arm 135 at substantially equal intervals so as to be aligned on the same straight lines. Furthermore, a plurality of rows of adjustment portions 137 aligned on the same straight line are formed on the front surface of the vibration arm 135. In the example of FIG. 8C, the numbers of the adjustment portions 137 included in the respective rows are equal to each other, and the adjustment portions 137 included in the different rows are aligned on the same straight lines between the respective rows. Moreover, the adjustment portions 137 included in the different rows may be formed so as to be aligned on the same straight lines every two rows, or may not be aligned on the same straight lines.

Figure 9:
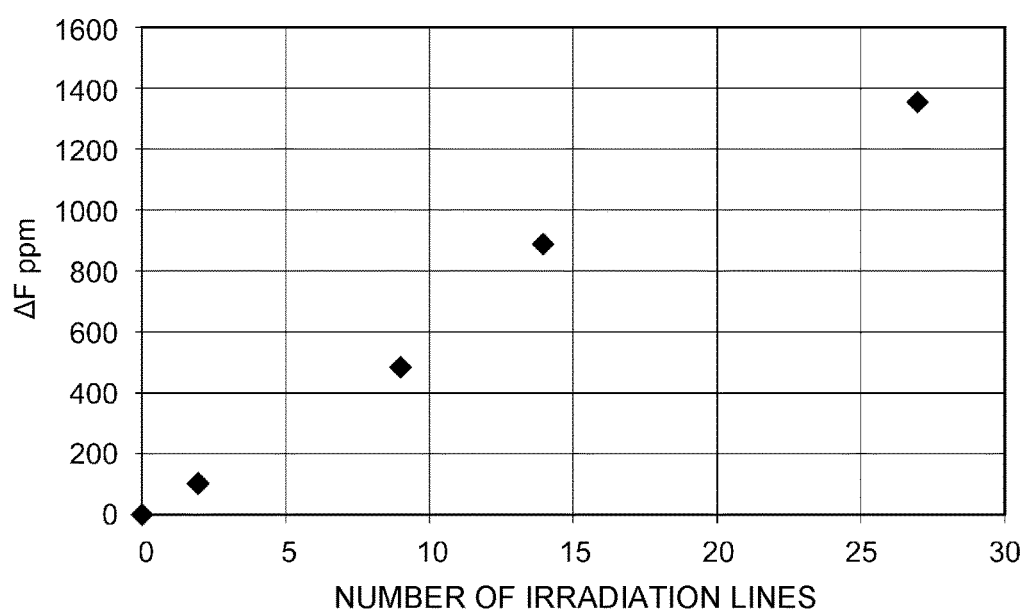
FIG. 9 is a diagram showing a relationship between the number of irradiation lines and a frequency shift amount in the case where multi-scan irradiation is performed.

FIG. 9 is a diagram showing a relationship between the number of irradiation lines and a frequency shift amount in the case where scan irradiation is performed with the following parameters.
Irradiation power: 0.4 W
Scan speed: 100 mm/sec
Irradiation width (X-axis direction): 40 μm
Focus position: the lower surface of the vibration arm 135

In this case, for example, adjustment portions 137 having the shape shown in FIG. 8B or FIG. 8C are formed on the lower surface of the vibration arm 135. In the graph shown in FIG. 9, the vertical axis indicates the frequency shift amount, and the horizontal axis indicates the number of irradiation lines (the number of processing lines). As shown in FIG. 9, it appears that the frequency shift amount is proportional to the number of irradiation lines and it is possible to increase the frequency shift amount by increasing the number of irradiation lines.

As described above, in the resonance device 1 according to the present embodiment, it is possible to adjust the resonant frequency after the resonance device 1 is packaged, by using non-degenerate silicon for the lower cover 20 and using degenerate silicon for the resonator 10. Accordingly, any processing step in which a thermal load or stress load acts is not present after the fine adjustment step, and thus it is possible to prevent occurrence of frequency fluctuations.

Second Embodiment

In second and subsequent embodiments, the description of matters common to the first exemplary embodiment is omitted, and the differences will be described. In particular, the same advantageous effects achieved by the same configuration are not mentioned successively in each embodiment.

Figure 10:
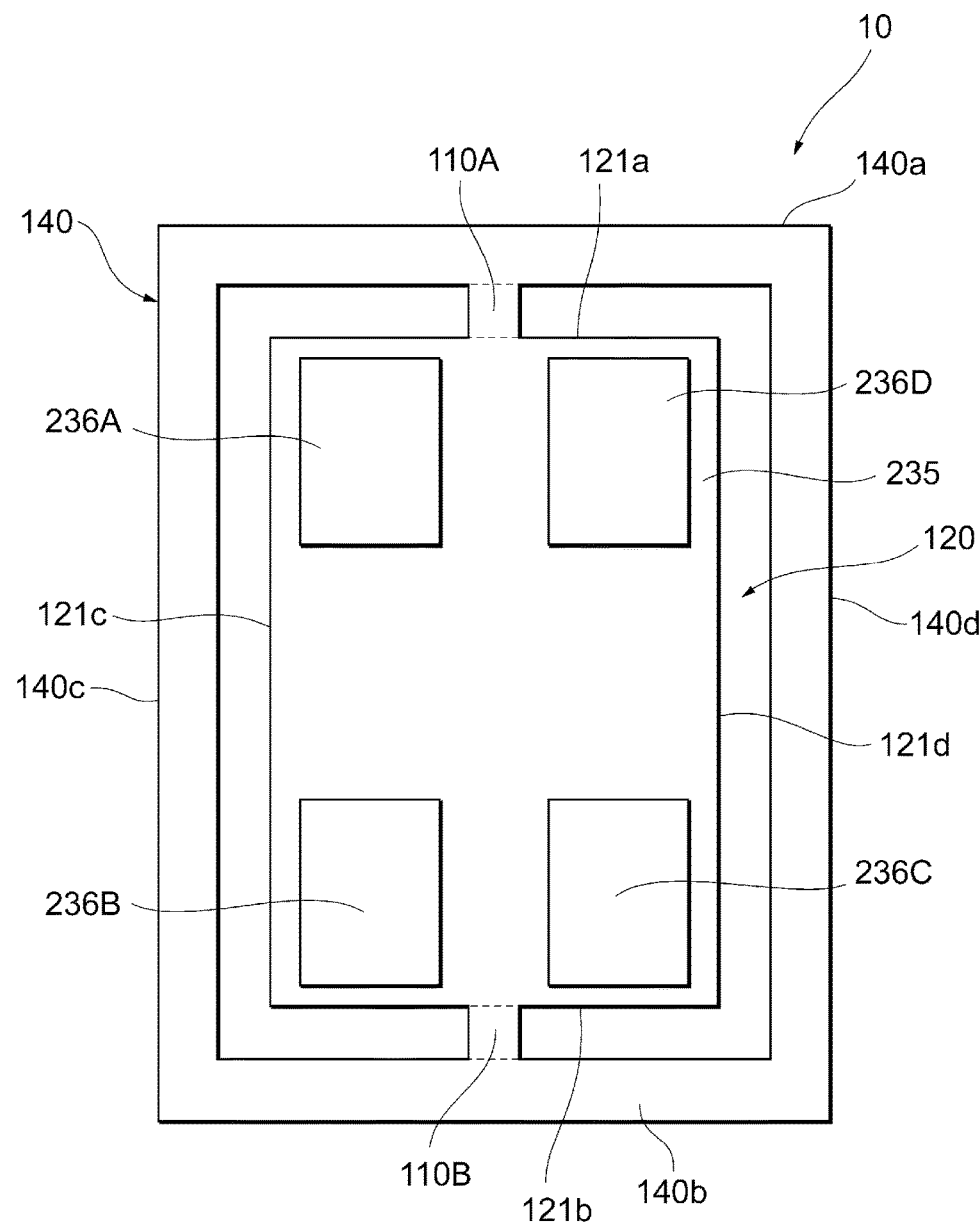
FIG. 10 is a plan view of a resonator according to a second exemplary embodiment, corresponding to FIG. 3, from which an upper substrate is removed.

FIG. 10 is a diagram showing an example of a plan view of a resonator 10 according to the present embodiment. Hereinafter, of the detailed configuration of the resonance device 1 according to the present embodiment, the difference from the first embodiment will be mainly described.

In the present embodiment, the resonator 10 is an in-pane vibrator that performs contour vibration in the XY plane. In the present embodiment, the metal layers E1 and E2 and the piezoelectric thin film F3 form a rectangular vibration portion 120.

As shown, the vibration portion 120 has a substantially rectangular parallelepiped contour spreading in a flat plate shape along the XY plane in a rectangular coordinate system in FIG. 10. In addition, the vibration portion 120 has short sides 121a and 121b in the X-axis direction and long sides 121c and 121d in the Y-axis direction. The vibration portion 120 is connected and held at the short sides 121a and 121b to the holding portion 140 by the holding arm 110. In addition, the protective film 235 is formed so as to cover the entire surface of the vibration portion 120. Furthermore, the four adjustment films 236A to 236D are laminated on the front surface of the protective film 235 and at four corners of the vibration portion 120.

Figure 11:
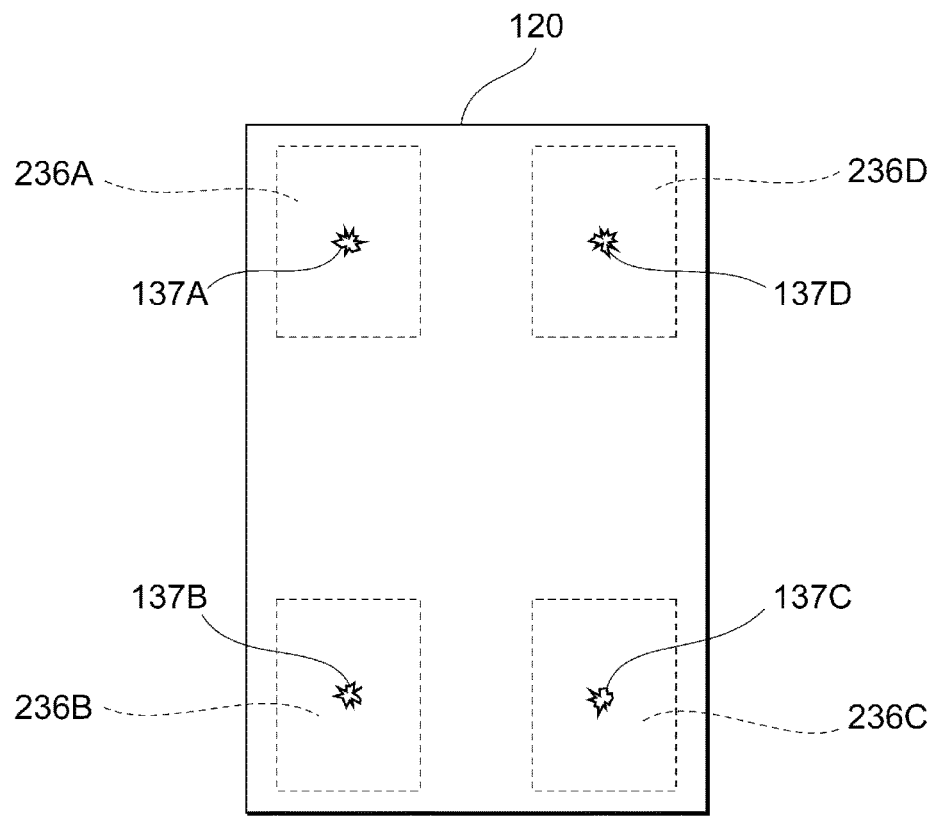
FIG. 11 is a plan view of the resonator according to the second exemplary embodiment, corresponding to FIG. 4, as seen from the lower cover side.

FIG. 11 is a diagram schematically showing the lower surface of the vibration portion 120 at the lower cover 20 side. As shown in FIG. 11, in the present embodiment, the adjustment portion 137 is formed at the four corners of the vibration portion 120.

The other configuration and function of the vibration portion 120 are the same as those of the first embodiment.

Referring back to FIG. 10, the configuration of the resonator 10 according to the second embodiment will be described.

In the present embodiment, the holding arm 110 has substantially rectangular two arms 110A and 110B each having long sides in the Y-axis direction and short sides in the X-axis direction.

Moreover, as shown, the arm 110A is connected at one end thereof to the vicinity of the center of the short side 121a of the vibration portion 120 and extends therefrom substantially perpendicularly along the Y-axis direction. In addition, the arm 110A is connected at another end thereof to the vicinity of the center of the frame body 140a of the holding portion 140.

Meanwhile, the arm 110B is connected at one end thereof to the vicinity of the center of the short side 121b of the vibration portion 120 and extends therefrom substantially perpendicularly along the Y-axis direction. In addition, the arm 110B is connected at another end thereof to the vicinity of the center of the frame body 140b of the holding portion 140.

The other configuration and function of the holding arm 110 are the same as those of the first embodiment and a description will not be repeated herein.

The other configuration and function of the resonance device 1 are the same as those of the first embodiment.

The exemplary embodiments of the present invention have been described above for illustrative purposes. Thus, a resonance device 1 according to the exemplary embodiment includes the lower cover 20 formed from non-degenerate silicon; the resonator 10 having the Si substrate F2 formed from degenerate silicon and having a lower surface opposing the lower cover 20, the metal layers E1 and E2 laminated on the Si substrate F2, and the piezoelectric thin film F3 formed between the metal layers E1 and E2 and having a surface corresponding to the upper surface of the Si substrate F2 with the metal layer E1 interposed therebetween. Moreover, the upper cover 30 is provided that faces the lower cover 20 with the resonator 10 interposed therebetween, and the lower surface of the Si substrate F2 has the adjustment portion 137 that is a region where the depth or height of projections and recesses formed on the surface is larger than that in another region of the lower surface of the Si substrate F2, or is a region where the area of the projections and recesses is larger than the other region of the lower surface of the Si substrate F2. Therefore, in the resonance device 1 according to the present embodiment, it is possible to adjust the resonant frequency even after the resonance device 1 is packaged, by using a laser having a wavelength at which the laser passes through non-degenerate silicon and is absorbed by degenerate silicon.

Preferably, the surface of the resonator 10 that opposes the upper cover 30 includes the first region and the second region that is a region that is different (i.e., having a different thickness) from the first region and in which displacement due to vibration of the resonator 10 is larger than that in the first region, and the adjustment portion 137 is provided on the lower surface of the Si substrate F2 and at a position corresponding to the second region. More preferably, the first region is covered with the protective film 235, and the second region is covered with the adjustment film 236 having a higher rate of weight reduction by etching than the protective film 235.

Preferably, the metal layers E1 and E2 and the piezoelectric thin film F3 of the resonator 10 form the vibration arm 135 that performs bending vibration, and the second region is formed near the distal end of the vibration arm 135.

Preferably, the metal layers E1 and E2 and the piezoelectric thin film F3 of the resonator 10 form the substantially rectangular vibration portion 120 that performs contour vibration, and the second region is a region corresponding to four corners of the vibration portion 120. In addition, the Si substrate F2 preferably includes the silicon oxide layer F2' on the lower surface.

The method for producing the resonance device 1 according to the present embodiment includes preparing the lower cover 20 formed from non-degenerate silicon; disposing the Si substrate F2 formed from degenerate silicon such that the lower surface of the Si substrate F2 opposes the lower cover 20, and sequentially forming the metal layer E1, the piezoelectric thin film F3, and the metal layer E2 on the upper surface of the Si substrate F2, to form the resonator 10; disposing the upper cover 30 formed from silicon, such that the upper cover 30 opposes the lower cover 20 with the resonator 10 interposed therebetween; and irradiating the lower surface of the Si substrate F2 with a laser via the lower cover 20 to form, on the lower surface of the Si substrate F2, the adjustment portion 137 that is a region where the depth or height of projections and recesses formed on the surface is larger than that in another region of the lower surface of the Si substrate F2 or is a region where the area of the projections and recesses is larger than that in the other region of the lower surface of the Si substrate F2. Therefore, in the method for producing the resonance device 1 according to the present embodiment, it is possible to adjust the resonant frequency even after the resonance device 1 is packaged, by using a laser having a wavelength at which the laser passes through non-degenerate silicon and is absorbed by degenerate silicon.

Preferably, the forming of the resonator 10 includes sequentially forming, on the surface of the metal layer E2, the protective film 235 and the adjustment film 236 having a higher rate of weight reduction by etching than the protective film 235; removing the second adjustment film in the first region of the resonator 10 to expose the first adjustment film; and adjusting the film thickness of the adjustment film 236 left in the second region of the resonator 10 in which displacement due to vibration is larger than that in the first region. Moreover, the forming of the adjustment portion 137, the adjustment portion 137 is formed on the lower surface of the Si substrate F2 and at a position corresponding to the second region.

In one aspect, the adjusting of the film thickness preferably comprises measuring the film thicknesses of the piezoelectric thin film F3 and the protective film 235; and adjusting the film thickness of the adjustment film 236 on the basis of the measured film thicknesses.

Particularly preferably, the adjusting of the film thickness comprises measuring the resonant frequency of the resonator 10; and adjusting the film thickness of the adjustment film 236 on the basis of the measured resonant frequency. In an exemplary aspect, it is possible to adjust the film thickness of the adjustment film 236 in consideration of variations in the resonant frequency based on the dimensions of the resonator 10. In addition, preferably, the forming of the resonator 10 includes forming the silicon oxide layer F2' on the lower surface of the Si substrate F2, and the forming of the adjustment film 236 includes forming the adjustment film 236 on the silicon oxide layer F2' or on the silicon oxide layer F2' and the Si substrate F2.

It is to be noted that each exemplary embodiment described above is intended to facilitate understanding of the present invention, but not intended to construe the present invention in any limited way. Modifications and/or improvements can be made to the present invention without departing from the spirit of the invention, and the present invention encompasses equivalents thereof. That is, each embodiment for which the design is changed as appropriate by a person skilled in the art is also included in the scope of the present invention as long as the features of the present invention are included. For example, each element included in each embodiment, and the arrangement, material, conditions, shape, size, etc. thereof are not limited to illustrated ones, and may be changed as appropriate. Moreover, it is needless to say that each embodiment is illustrative and the components in the different embodiments may be partially replaced or combined, and they are also included in the scope of the present invention as long as the features of the present invention are included.

REFERENCE SIGNS LIST 1 resonance device
10 resonator
30 upper cover
20 lower cover
140 holding portion
140a to 140d frame body
110 holding arm
120 vibration portion
130 base portion
135A to 135D vibration arm
136A to 136D weight portion
137A to 137D adjustment portion
F2 Si substrate
F2' silicon oxide layer (temperature characteristic correction layer)
235 protective film
236 adjustment film

The invention claimed is:

1. A resonance device comprising:
a lower cover comprising a non-degenerate silicon;
a resonator including:
a substrate comprising a degenerate silicon and having a lower surface facing the lower cover,
first and second electrode layers disposed above the substrate, and
a piezoelectric film disposed between the first and second electrode layers and having a surface facing an upper surface of the substrate with the first electrode layer interposed therebetween; and
an upper cover opposing the lower cover with the resonator interposed therebetween,
wherein the lower surface of the substrate includes an adjustment portion that is a region of the substrate having a different thickness than a thickness in another region of the substrate.

2. The resonance device according to claim 1, wherein the adjustment portion is disposed where a depth or height of at least one of a projection and a recess on the lower surface of the substrate is larger than in the other region of the substrate.

3. The resonance device according to claim 1, wherein the adjustment portion is disposed where an area of at least one of a projection and a recess on the lower surface of the substrate is larger than in the other region of the substrate.

4. The resonance device according to claim 1, wherein the resonator comprises a surface that faces the upper cover and includes a first region and a second region different from the first region and configured such that displacement in the second region due to vibration of the resonator is larger than displacement in the first region due to the vibration.

5. The resonance device according to claim 4, wherein the adjustment portion is disposed on the lower surface of the substrate and at a position corresponding to the second region relative to a thickness direction of the resonator.

6. The resonance device according to claim 5, wherein a first adjustment film is disposed on the first region and a second adjustment film is disposed on the second region and has a higher rate of weight reduction by etching than the first adjustment film.

7. The resonance device according to claim 5, further comprising at least one vibration arm that includes the first electrode layer, the second electrode layer, and the piezoelectric film, with the second region being disposed closer to a free end of the at least one vibration arm than a fixed end of the at least one vibration arm.

8. The resonance device according to claim 5, further comprising a rectangular vibration portion configured to perform contour vibration, wherein the rectangular vibration portion includes the first electrode layer, the second electrode layer, and the piezoelectric film and the second region is disposed at a plurality of regions corresponding to four corners of the rectangular vibration portion.

9. The resonance device according to claim 1, wherein the substrate includes a silicon oxide film disposed on the lower surface thereof.

10. A resonance device comprising:
a frame; and
a resonator disposed in the frame with at least one holding arm connecting the resonator to the frame, the resonator including a base and a plurality of vibration arms extending therefrom,
wherein each of the plurality of vibration arms includes an adjustment portion disposed on a first surface thereof facing one of a upper cover and a lower cover of the resonance device, such that each of the plurality of vibration arms has greater thickness where the adjustment portion is disposed than another region of the respective vibration arm.

11. The resonance device according to claim 10, wherein each of the plurality of vibration arms has a fixed end connected to the base and a free end opposite the fixed end, and the adjustment portion of each of the vibration arms is disposed closer to the free end than the fixed end of the respective vibration arm.

12. The resonance device according to claim 10,
wherein each of the plurality of vibration arms includes a second surface opposite the first surface that includes a first region and a second region different than the first region and configured such that displacement due to vibration of the resonator is larger in the second region than displacement in the first region due to the vibration, and
wherein the adjustment portion is disposed on the lower surface of the substrate and at a position corresponding to the second region relative to a thickness direction of the resonator.

13. The resonance device according to claim 12, wherein a first adjustment film is disposed on the first region and a second adjustment film is disposed on the second region and has a higher rate of weight reduction by etching than the first adjustment film.

14. A method for manufacturing a resonance device, the method comprising:
preparing a lower cover formed from a non-degenerate silicon;
disposing a substrate formed from degenerate silicon such that a lower surface of the substrate faces the lower cover;
forming a resonator by sequentially forming a first electrode layer, a piezoelectric film, and a second electrode layer on an upper surface of the substrate;
disposing an upper cover formed from silicon above the resonator, such that the resonator is interposed between the upper and lower covers; and
irradiating the lower surface of the substrate with a laser via the lower cover to form an adjustment portion in a region, such that the substrate has a different thickness where the adjustment portion is disposed than a thickness in another region of the substrate.

15. The method for manufacturing the resonance device according to according to claim 14, wherein irradiating the lower surface forms the adjustment portion, such that a depth or height of at least one of a projection and a recess on the lower surface of the substrate is larger than in the other region of the substrate.

16. The method for manufacturing the resonance device according to according to claim 14, wherein irradiating the lower surface forms the adjustment portion, such that an area of at least one of a projection and a recess on the lower surface of the substrate is larger than in the other region of the substrate.

17. The method for manufacturing the resonance device according to claim 14, wherein forming the resonator comprises:
sequentially forming, on a surface of the second electrode layer, a first adjustment film and a second adjustment film having a higher weight reduction by etching than the first adjustment film;
removing the second adjustment film in a first region of the resonator to expose the first adjustment film; and
adjusting a film thickness of the second adjustment film remaining in a second region of the resonator in which displacement due to vibration is larger than displacement in the first region,
wherein the forming of the adjustment portion includes forming the adjustment portion on the lower surface of the substrate and at a position corresponding to the second region relative to a thickness direction of the resonator.

18. The method for manufacturing the resonance device according to claim 17, wherein the adjusting of the film thickness comprises:
measuring film thicknesses of the piezoelectric film and the first adjustment film; and
adjusting the film thickness of the second adjustment film based on the measured film thicknesses of the piezoelectric film and the first adjustment film.

19. The method for manufacturing the resonance device according to claim 17, wherein the adjusting of the film thickness comprises:
measuring a resonant frequency of the resonator; and
adjusting the film thickness of the second adjustment film based on the measured resonant frequency of the resonator.

20. The method for manufacturing the resonance device according to claim 14,
wherein the forming of the resonator comprises forming a silicon oxide film on the lower surface of the substrate, and
wherein the forming of the adjustment region comprises forming the adjustment region in or on at least one of the silicon oxide and the substrate.

* * * * *